United States Patent [19]

Shapiro

[11] 4,357,682
[45] Nov. 2, 1982

[54] CONDUCTORLESS TRANSFER FOR MAGNETIC BUBBLE MEMORIES

[75] Inventor: Herbert M. Shapiro, Bridgewater, N.J.

[73] Assignee: Bell Telephone Laboratories, Incorporated, Murray Hill, N.J.

[21] Appl. No.: 209,900

[22] Filed: Nov. 24, 1980

[51] Int. Cl.³ ............................................. G11C 19/08
[52] U.S. Cl. ................................. 365/16; 365/23; 365/39
[58] Field of Search ................ 365/15, 16, 23, 24, 365/39

[56] References Cited

U.S. PATENT DOCUMENTS

| | | |
|---|---|---|
| 3,613,058 | 10/1971 | Bonyhard et al. |
| 4,086,661 | 4/1978 | Matsuyama et al. .............. 365/39 |
| 4,157,591 | 6/1979 | Dekker et al. ..................... 365/19 |

FOREIGN PATENT DOCUMENTS 706879 12/1979 U.S.S.R. ................................ 365/39

Primary Examiner—James W. Moffitt
Attorney, Agent, or Firm—Herbert M. Shapiro

[57] ABSTRACT

A conductorless transfer is provided for a large-gap tolerant Permalloy pattern for moving magnetic bubbles. The transfer capitalizes on the symmetry of the elements for enabling a field reversal to achieve transfer.

7 Claims, 6 Drawing Figures

CONDUCTORLESS TRANSFER FOR MAGNETIC BUBBLE MEMORIES

FIELD OF THE INVENTION

This invention relates to magnetic bubble memories, and more particularly, to such memories in which bubbles move along a path defined by magnetic elements responsive to a reorienting in-plane drive field.

BACKGROUND OF THE INVENTION

Magnetic bubble memories are well known in the art. Commercially available bubble memories are characterized by patterns of elements, typically Permalloy, responsive to a magnetic drive field reorienting in the plane of bubble movement for moving bubbles along paths defined by those elements. Memories of this type are called "field-access" memories and are organized in the familiar major-minor mode.

A major-minor mode, magnetic bubble memory is characterized by a plurality of closed minor loops and at least one major path or loop. Bubbles recirculate in the minor loops through reference positions from which movement between the minor loops and the major path can occur.

Typically bubble movement between loops occurs by transfer resulting in vacancies remaining in the selected address of the minor loops. The bubble pattern transferred out of the minor loops is advanced to a detector in the major loop and subsequently is returned to the reference positions for transfer back to the selected address. Alternatively, the transferred out pattern is annihilated and substitute data is transferred back into the minor loops. A bubble generator is coupled to the major loop for this purpose. The numbers of stages of the various loops are designed to permit restored or substitute data to be placed in vacancies created in the minor loops by an initial transfer-out operation.

The various operations are controlled by control circuit which includes a counter and an address generator to track numbers of drive field cycles and the instant address of data occupying the reference positions. Transfer occurs in prior art arrangements typically by the application of a current pulse to an electrical conductor electrically coupling the elements defining the above-mentioned reference positions in sequence. But such an electrical conductor is defined in a metallic film overlying the Permalloy pattern and separated from it by an oxide layer. Consequently, significant extra processing is required to provide a conductor driven transfer function. Moreover, a number of transfer points are defined typically. Therefore, the conductor pattern is intricate and there is a reduction in yield associated with it. One problem to which this invention is directed, therefore, is to provide a conductorless transfer. Of course, conductorless bubble transfers are known. U.S. Pat. No. 3,613,058, of P. I. Bonyhard, D. E. Kish, and J. L. Smith issued Oct. 12, 1971, for example, discloses one such arrangement.

Copending application, Ser. No. 209,901 filed on even date herewith, discloses a new arrangement for bubble propagation. The arrangement is of the field-access type involving Permalloy elements and are orienting magnetic field. But the elements are permissive of unexpectedly wide gaps between elements. Specifically, whereas prior art, field-access memories required gaps less than the collapse diameter of a bubble and periods of greater than 4 to 5 times the strip out diameter, the wide gap arrangement permits gaps of about double the collapse diameter. Since, the gap is the limiting feature for bubble memories, the larger the gap, the more dense the memory for any given photolithographic capability.

The particular problem to which this invention is directed is to provide a conductorless transfer for a wide gap, field access bubble memory of the type described in the above-mentioned copending application.

BRIEF DESCRIPTION OF THE INVENTION

The wide gap arrangement of the above-mentioned copending application employs a sequence of like-shaped Permalloy elements to define a path for bubble propagation such as a minor loop or a major loop. The present invention is based on the recognition that the elements have shapes that allow the elements of one path to be disposed adjacent those of another path in such a fashion that a bubble moving aong one path can be made to move to the next consecutive element in that path or to an element in a next adjacent path in response to reorientations of the in-plane field in a first or second direction respectively.

DETAILED DESCRIPTION

Figures 1, 3:
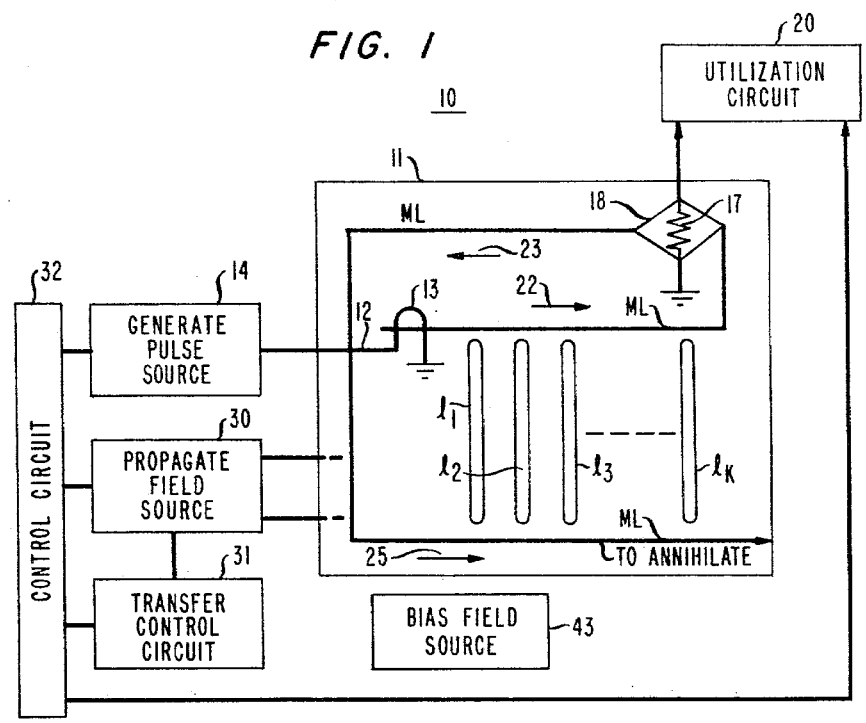
FIG. 1 is a schematic block diagram of a magnetic bubble memory.
FIG. 3 is an alternative top view of a transfer arrangement in accordance with this invention.

FIG. 1 shows a magnetic bubble memory 10 including a layer of material 11 in which magnetic bubbles can be moved.

A plurality of paths is defined in layer 11 by a pattern of Permalloy elements represented by closed curves $1_1$, $1_2$, $1_3$, ... $1_k$, and ML in FIG. 1. Curves $1_1$ ... $1_k$ represent the recirculating minor loops of a major-minor, bubble memory and curve ML represents the major path. The major path can be seen in FIG. 1 to be formed into a G-shaped path—(actually an e-shape) as viewed. Major paths of this type of configuration operate to insure that the data sequence is not disturbed during a transfer-out transfer-in sequence as is well known.

The minor loops are adapted to recirculate bubble patterns in response to the in-plane drive field. The major path is adapted to access the minor loops. To this end, a conductor 12 couples the major path in a manner to define a bubble generator at 13. Conductor 12 is connected between a generate pulse source 14 and ground.

The major loop also includes a detector 17 defined in an expander (and contracting) detector arrangement by chevron-shaped elements. The detector arrangement is designated 18 in the figure. Detector 17 is defined by a conductor connected between utilization circuit 20 and ground.

The minor loops come into close proximity with portions of the major path at the ends of those loops as can be seen in the figure. Transfer-out of bubbles from the minor loops into the major path occurs at the top of the loops as viewed. Transfer in occurs at the bottom. Thus, the general operation of the memory requires that data transferred out of the minor loops moves to the right in path ML as indicated by arrow 22. The bubbles expand as they move to the left through arrangement 18 and generate signals in detector 17 which are applied to circuit 20. The bubbles then contract, recirculate to the left as indicated by arrow 23, and are transferred back into the minor loops at the bottom of those loops. Bubbles not transferred in move to the right as indicated by arrow 25 and are annihilated typically by movement into a guard rail as is common.

We will now turn our attention to the transfer-in and transfer out operation. First, it is helpful to remember that all bubble movement is caused by a magnetic field reorienting, usually by rotating, in the plane of bubble movement. Such a field is provided by a propagate field source 30. Transfer of bubbles both in and out of the minor loops is accomplished herein by a properly phased reversal of that field's direction of rotation. Transfer control circuit 31 is adapted to alter the direction of the field rotation under the control of control circuit 32. Control circuit 32 is adapted to synchronize and control all functions herein and is assumed to include a clock, counters, and address generators for this purpose as is now well understood in the art.

Figure 2:
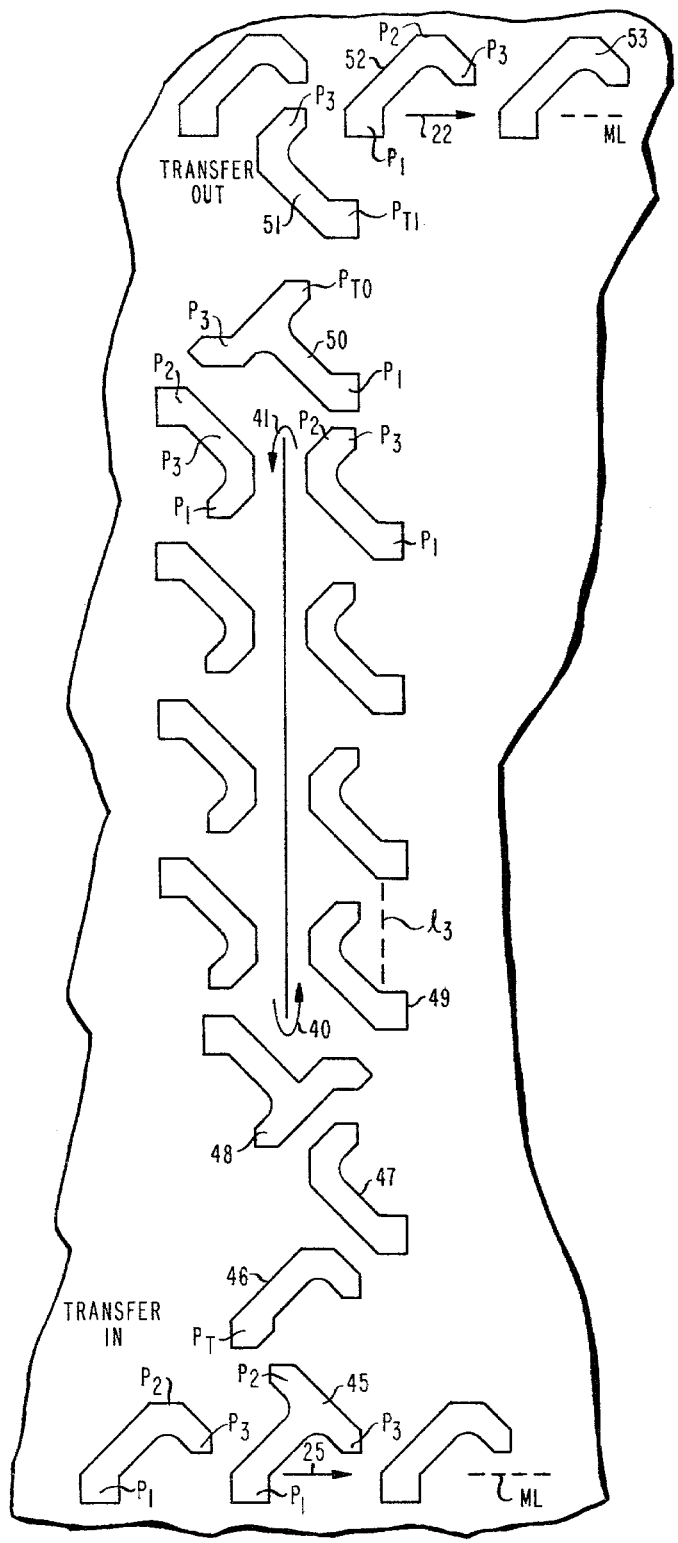
FIG. 2 is an enlarged top view of an arrangement of bubble propagation elements in accordance with one embodiment of this invention for use in the memory of FIG. 1.

FIG. 2 shows an enlarged top view of a minor loop (viz. $1_3$) about which bubbles recirculate counterclockwise as indicated by curved arrows 40 and 41 in the figure. The pattern is for an eight micron circuit where the nominal bubble diameter is 1.7 microns maintained by a bias field supplied by source 43 of FIG. 1. The collapse diameter is one micron and the gaps are two microns. The Permalloy layer is 2000 Angstrom units on a 6000 Angstrom unit $SiO_2$ layer.

The normal clockwise rotation of the drive field moves bubbles through the sequence of positions $P_1$, $P_2$, and $P_3$ as designated in FIG. 2. When a bubble reaches position $P_2$ of element 45, control circuit 32 signals the transfer control circuit to reverse the direction of rotation of the drive field. In response, a bubble occupying position $P_2$ of element 45 at the time of the reversal moves to position $P_T$ at element 46. All remaining (untransferred) bubbles are now in positions $P_1$. Clockwise rotation now continues with the transferred bubble moving upward along element 45 to elements 46, 47, 48, and 49, for continued counterclockwise movement about loop $1_3$ as indicated by arrow 40. Transfer in is now complete.

The transfer-out operation commences when a bubble reaches position $P_1$ of element 50 in FIG. 2. At this juncture, the clockwise rotation of the field is reversed and a bubble in that position moves to the transfer position $P_{TO}$ of element 50. The clockwise rotation is resumed and the bubble, in transfer, moves through the sequence of positions $P_1$, $P_2$, $P_3$ to position $P_{T1}$ of element 51. Transfer out is now complete and a transferred bubble merges and moves to the right in path ML as shown by arrow 22.

The reversal of the field for the transfer-out operation appears to be the limiting factor in phase margins. Specifically, a reversal causes a bubble at position $P_1$ of element 50 to move to position $P_{TO}$ there. Of course, all similarly placed bubbles tend to move in a like manner from positions $P_1$ to positions $P_3$ of the associated elements. But element 50 has a distorted T-shaped geometry which strengthens the poles at $P_{TO}$ of element 50. Consequently, a bubble at position $P_1$ of element 50 moves to position $P_{TO}$ there before other similarly place bubbles move. The phase window for the transfer-out operation thus is limited. The phase margin is adjusted by shaping element 50 so that positions $P_1$ and $P_{TO}$ there are relatively closely spaced.

Of course, each minor loop of FIG. 1 is configured as shown in FIG. 2. Therefore, every transfer operation occurs at each minor loop causing a complete bubble pattern to transfer-out of the minor loops for movement to major path ML and thus to detector 17 or for moving a pattern into the minor loops at the bottom end thereof as seen in FIG. 1.

Figure 4:
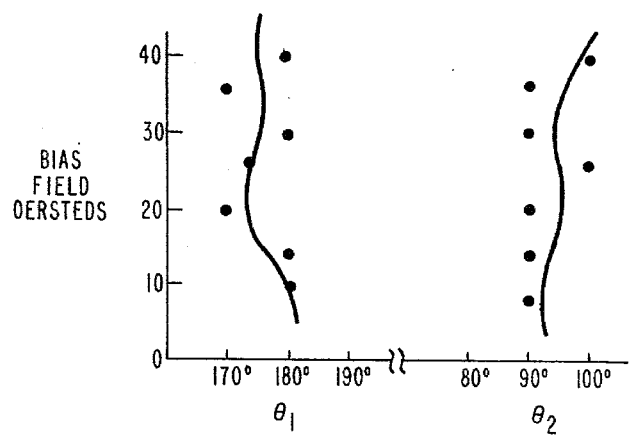
FIG. 4 is a margin plot of the operation of the arrangement of FIG. 3.
Figure 5:
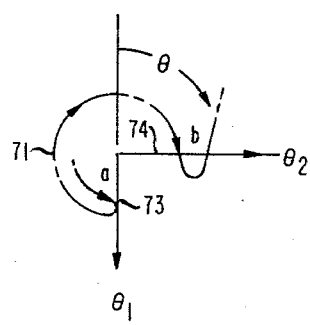
FIGS. 5 and 6 are phase diagrams of the operation of the arrangement of FIG. 3.

FIG. 3 shows a plurality of (60 ... 66) of T-shaped Permalloy elements oriented along a diagonal with respect to the axis of the bubble path as viewed and arranged in two rows. FIG. 4 shows the phase margin data for the test arrangement of FIG. 3 for transfer in response to phase reversals at phase $\theta_1$ and phase $\theta_2$ as shown in FIGS. 5 and 6 respectively.

Counterclockwise rotation of the drive field moves a bubble from right to left along elements 63, 62, and 61 crossing gap a to position 70. The rotating field reverses at this angle ($\theta_1$) to a clockwise movement represented by curve 71 in FIG. 5. Angle $\theta_1$, represents the phase at which the jump across gap a is completed. The bubble transfers to element 64 crossing gap b by the time the drive field is at angle $\theta_2$ for completing the transfer. Angle $\theta_2$ represents the phase at which the jump across gap b occurs. Counterclockwise rotation resumes at this juncture, the transferred bubble now moving from right to left along the top row of elements as viewed. Arrows 73 and 74 in FIG. 5 represent the drive field directions at phase $\theta_1$ and $\theta_2$.

Figure 6:
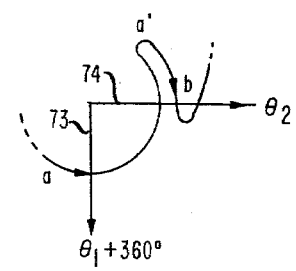

FIG. 6 shows a drive field reversed when a bubble is in position a' on element 60. Counterclockwise rotation resumes when the drive field has just passed the $\theta_2$ phase as shown. Therefore, transfer can occur via a 270-degree field reversal or a 90-degree field reversal as shown in FIGS. 5 and 6, respectively. Actual plotted data are shown as dots in FIG. 4 for the reversals of FIG. 5 ($\theta_1$) and FIG. 6 ($\theta_2$), respectively. The resulting curves indicate little change in phase margins for either reversal mode over a significant range of bias fields. Transfer was achieved over the full propagation range for the test circuits, a range which extended from strip out to collapse.

What has been described is considered merely illustrative of the principles of this invention. Therefore, various modifications can be devised by those skilled in the art in accordance with the spirit and scope of this invention as encompassed by the following claims.

I claim:

1. A magnetic bubble memory including a layer of magnetic material in which magnetic bubbles having a minimum diameter d can be moved, and propagations means for moving bubbles in said layer synchronously along at least first and second paths responsive to a magnetic field reorienting in a first direction in the plane of said layer, said propagation means including a pattern of magnetic elements spaced apart distances large compared with d and defining at least a first transfer position for moving bubbles between said first and second paths in response to reorientation of said field in a second direction.

2. A magnetic bubble memory in accordance with claim 1 including a plurality of second paths, each of said second paths being adopted to circulate bubbles thereabout through a transfer position.

3. A magnetic bubble memory in accordance with claim 2 wherein said paths are defined by elements having first and second legs of long and relatively short lengths respectively, said legs being connected at an angle to one another and disposed at an angle to the axis of movement of a bubble along a path defined by the elements.

4. A memory in accordance with claim 3 wherein the magnetic elements comprise Permalloy and adjacent ones of said elements are spaced apart a distance greater than d.

5. A memory in accordance with claim 3 in which adjacent elements in said first and second paths at said transfer positions are disposed such that said second leg of one of said elements in said first path is spaced apart from the first leg of the next adjacent element in one of said second path in a manner such that the two elements define a field gradient for moving a bubble across a gap therebetween when said field is at an angle for transferring said bubble.

6. A memory in accordance with claim 5 wherein said elements are spaced apart a distance equal to $2d$.

7. A magnetic bubble memory (10) including a layer of magnetic material in which magnetic bubbles having a minimum diameter d can be moved, and propagation means ($1_1 \ldots 1_k$ ML and 30) for moving bubbles in the layer synchronously along at least first and second paths (ML and $L_3$ of FIG. 2) responsive to a magnetic field reorienting in a first direction in the plane of the layer, the memory being CHARACTERIZED BY a pattern of magnetically soft elements (FIGS. 2 and 3) spaced apart distances large compared with d and defining at least a first transfer position ($P_2$ to $P_T$ on elements 45 and 46 in FIG. 2) for moving bubbles between the first and second paths (ML and $L_3$) in response to a reorientation of the magnetic field in a second direction.

* * * * *